United States Patent
Chrysler et al.

(10) Patent No.: US 7,098,079 B2
(45) Date of Patent: *Aug. 29, 2006

(54) ELECTRONIC ASSEMBLY WITH HIGH CAPACITY THERMAL INTERFACE AND METHODS OF MANUFACTURE

(75) Inventors: Gregory M. Chrysler, Chandler, AZ (US); Abhay A. Watwe, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/655,728

(22) Filed: Sep. 5, 2003

(65) Prior Publication Data

US 2004/0082188 A1    Apr. 29, 2004

Related U.S. Application Data

(62) Division of application No. 09/737,117, filed on Dec. 14, 2000, now Pat. No. 6,653,730.

(51) Int. Cl.
    *H01L 21/44*    (2006.01)
(52) U.S. Cl. .............................. 438/122; 257/E31.131
(58) Field of Classification Search ................ 438/121, 438/122; 257/E31.131
    See application file for complete search history.

(56) References Cited

U.S. PATENT DOCUMENTS

| 5,291,064 | A | 3/1994 | Kurokawa | 257/714 |
|---|---|---|---|---|
| 5,508,230 | A | 4/1996 | Anderson et al. | 437/183 |
| 5,895,972 | A | 4/1999 | Paniccia | 257/706 |
| 5,907,189 | A | 5/1999 | Mertol | 257/787 |
| 5,985,412 | A | 11/1999 | Gosele | 428/172 |
| 6,091,603 | A | 7/2000 | Daves et al. | 361/704 |
| 6,114,256 | A | 9/2000 | Bachli et al. | 438/764 |
| 6,118,177 | A | 9/2000 | Lischner et al. | 257/706 |
| 6,245,249 | B1 | 6/2001 | Yamada et al. | 216/33 |
| 6,292,369 | B1 * | 9/2001 | Daves et al. | 361/719 |
| 6,316,826 | B1 * | 11/2001 | Yamamoto et al. | 257/705 |
| 6,317,326 | B1 | 11/2001 | Vogel et al. | 361/704 |
| 6,390,181 | B1 | 5/2002 | Hall et al. | 165/80.3 |
| 6,706,562 | B1 * | 3/2004 | Mahajan et al. | 438/125 |

FOREIGN PATENT DOCUMENTS

| EP | 0350593 | 1/1990 |
|---|---|---|
| EP | 0915504 | 5/1999 |
| EP | 0915504 A1 | 5/1999 |
| WO | WO-01/31082 | 5/2001 |

OTHER PUBLICATIONS

"High Thermal Performance Electronic Package Utilizing a Combination of Heat Spreader Members", *IBM Technical Disclosure Bulletin*, vol. 35, No. 3,(Aug. 1992),397-398.

(Continued)

*Primary Examiner*—Bradley K. Smith
(74) *Attorney, Agent, or Firm*—Schwegman, Lundberg, Woessner & Kluth, P.A.

(57) ABSTRACT

To accommodate high power densities associated with high performance integrated circuits, an integrated circuit package includes a heat-dissipating structure in which heat is dissipated from a surface of one or more dice to an integrated heat spreader (IHS) through a high capacity thermal interface formed of diamond, a diamond composite, or graphite. In an embodiment, a diamond layer is grown on the IHS. In another embodiment, a diamond layer is separately formed and affixed to the IHS. Methods of fabrication, as well as application of the package to an electronic assembly and to an electronic system, are also described.

27 Claims, 8 Drawing Sheets

OTHER PUBLICATIONS

Suga, T., et al., "A new wafer-bonder of ultra-high precision using surface activated bonding (SAB) Concept", *Proceedings of the 2001 IEEE electronic Components and Technology Conference*, (May 1-Jun. 1, 2001),6 pgs.

Takagi, H., "Surface activated bonding of silicon wafers at room temperature", *Applied Physics Letter*, vol. 68, (Apr. 1996),2222-2224.

* cited by examiner

ELECTRONIC ASSEMBLY WITH HIGH CAPACITY THERMAL INTERFACE AND METHODS OF MANUFACTURE

DIVISIONAL APPLICATION

The present application is a divisional of application U.S. Ser. No. 09/737,117, filed on Dec. 14, 2000, now issued as U.S. Pat. No. 6,653,730.

TECHNICAL FIELD

The inventive subject matter relates generally to electronics packaging. More particularly, the inventive subject matter relates to an electronic assembly that includes an integrated circuit package comprising a high capacity thermal interface between the integrated circuit and a heat spreader to dissipate heat generated in a high performance integrated circuit, and to manufacturing methods related thereto.

BACKGROUND INFORMATION

Integrated circuits (IC's) are typically assembled into packages by physically and electrically coupling them to a substrate made of organic or ceramic material. One or more IC packages can be physically and electrically coupled to a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of IC's on substrates, where each new generation of packaging must provide increased performance, particularly in terms of an increased number of components and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments, including IC packages.

An IC substrate may comprise a number of metal layers selectively patterned to provide metal interconnect lines (referred to herein as "traces"), and one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as IC's, of the system. Some IC's have a relatively large number of input/output (I/O) terminals (also called "lands"), as well as a large number of power and ground terminals or lands.

As the internal circuitry of IC's, such as processors, operates at higher and higher clock frequencies, and as IC's operate at higher and higher power levels, the amount of heat generated by such IC's can increase their operating temperature to unacceptable levels.

For the reasons stated above, and for other reasons stated below which will become apparent to those skilled in the art upon reading and understanding the present specification, there is a significant need in the art for apparatus and methods for packaging an IC on a substrate that minimize heat dissipation problems associated with high clock frequencies and high power densities.

DETAILED DESCRIPTION

In the following detailed description of embodiments of the inventive subject matter, reference is made to the accompanying drawings which form a part hereof, and in which is shown by way of illustration, but not of limitation, specific preferred embodiments in which the inventive subject matter may be practiced, including a preferred embodiment. These embodiments are described in sufficient detail to enable those skilled in the art to practice them, and it is to be understood that other embodiments may be utilized and that structural, mechanical, compositional, and electrical changes may be made without departing from the spirit and scope of the inventive subject matter. The following detailed description is, therefore, not to be taken in a limiting sense, and the scope of embodiments of the inventive subject matter is defined only by the appended claims. Such embodiments of the inventive subject matter may be referred to, individually and/or collectively, herein by the term "invention" merely for convenience and without intending to voluntarily limit the scope of this application to any single invention or inventive concept if more than one is in fact disclosed.

Embodiments of the present invention provide a solution to thermal dissipation problems that are associated with prior art packaging of integrated circuits that have high circuit density and that operate at high clock speeds and high power levels, by employing a high capacity thermal material as a thermal interface between one or more IC's and a heat spreader. Various embodiments are illustrated and described herein.

In an embodiment, a front surface of an IC die is flip-chip mounted to an organic land grid array (OLGA) substrate using "controlled collapse chip connect" (C4) technology. A high capacity thermal interface material is attached between the back surface of the die and an integrated heat spreader (IHS) after suitable preparation of the die and IHS surfaces. In an embodiment, the high capacity thermal material comprises diamond, a diamond composite, or graphite. A side wall of the IHS can also be coupled to the OLGA substrate around the die periphery with a suitable thermal sealant in order to provide further heat dissipation as well as mechanical strength.

Figure 1:
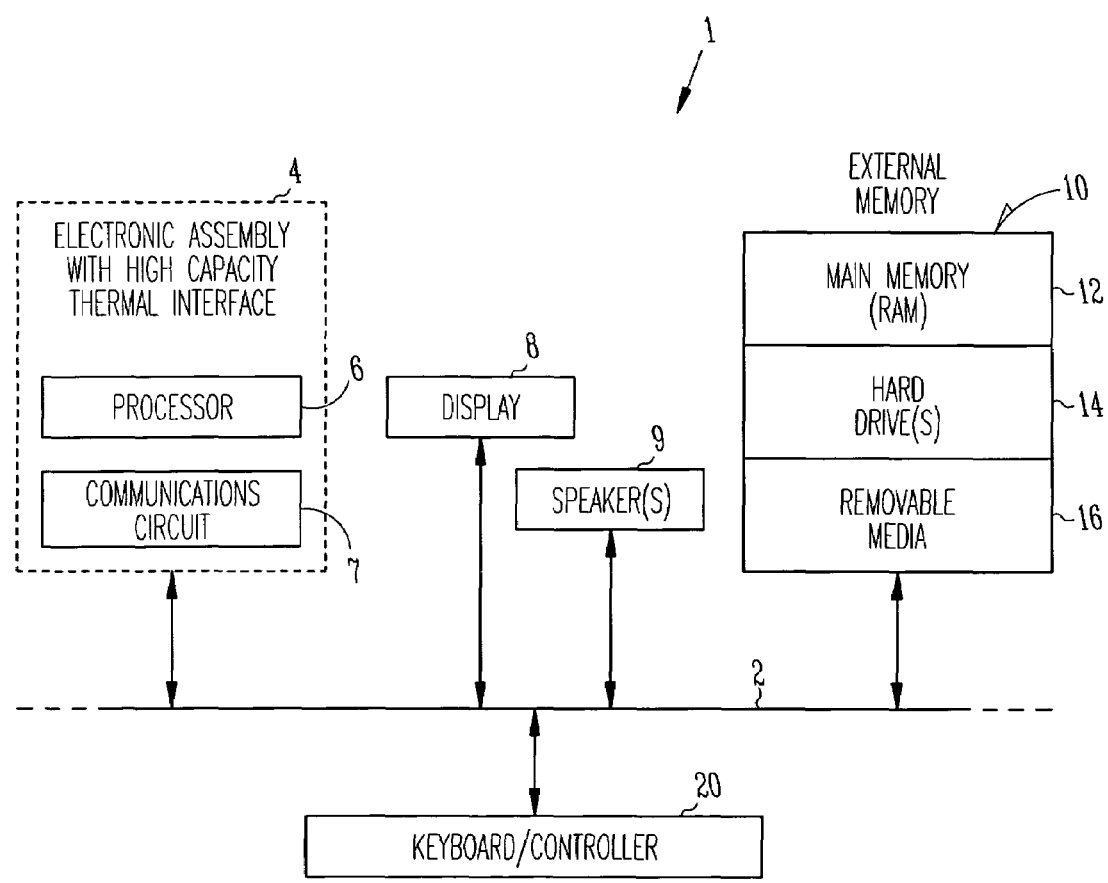
FIG. 1 is a block diagram of an electronic system incorporating at least one electronic assembly with a high capacity thermal interface in accordance with an embodiment of the inventive subject matter.

FIG. 1 is a block diagram of an electronic system 1 incorporating at least one electronic assembly 4 with a high capacity thermal interface in accordance with an embodiment of the inventive subject matter. Electronic system 1 is merely one example of an electronic system in which embodiments of the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In an embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, one or more speakers 9, and a keyboard and/or controller 20, which can include a mouse, trackball, game controller, voice-recognition device, or any other device that permits a system user to input information into and receive information from the electronic system 1.

Figure 2:
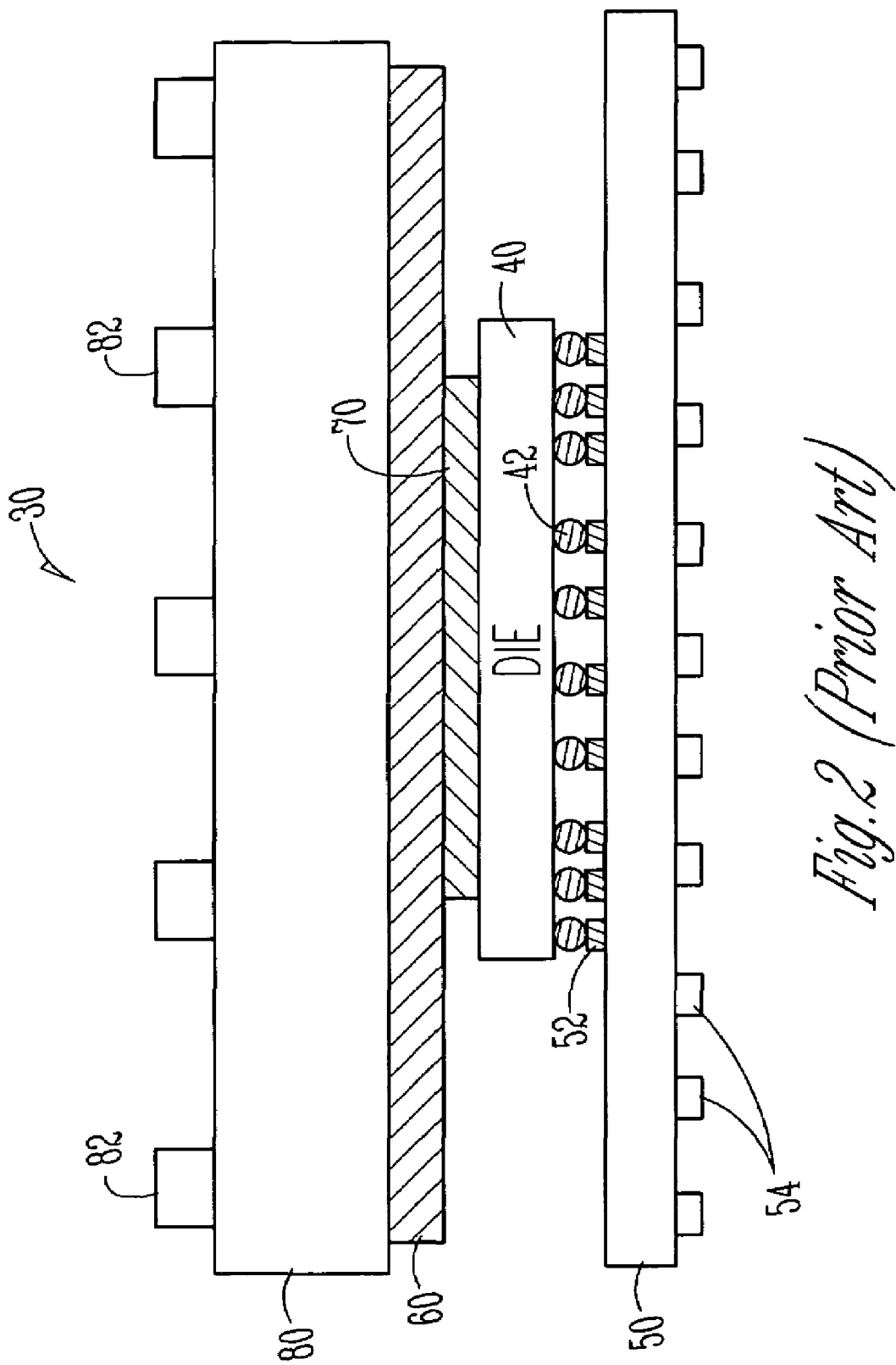
FIG. 2 illustrates a cross-sectional representation of a prior art IC package.

FIG. 2 illustrates a cross-sectional representation of a prior art IC package 30. IC package 30 represents a typical prior art structure that includes an IC die 40 mounted in "flip-chip" orientation with its lands (not shown) facing downward to couple with corresponding lands 52 on the upper surface of a substrate 50 through solder balls or bumps 42. Substrate 50 can be a one-layer board or a multi-layer board, and it can include additional lands 54 on its opposite surface for mating with additional packaging structure (not shown).

Die 40 generates its heat from internal structure, including wiring traces, that is located near its lower surface; however, most of the heat is dissipated through its upper surface. Heat that is concentrated within die 40 is dissipated to a large surface that is in contact with die 40 in the form of a heat spreader 60 that is typically formed of metal such as copper or aluminum. To improve the thermal conductivity between die 40 and the heat spreader 60, a thermal interface material 70 is often provided between die 40 and heat spreader 60. The thermal interface material 70 typically is a thermal gel or grease containing metal particles.

To further dissipate heat from heat spreader 60, a heat sink 80 optionally having heat fins 82 is often coupled to heat spreader 60. Heat sink 80 dissipates heat into the ambient environment.

An increase in the junction temperature $T_j$ of an electronic device on the IC can adversely affect the operating lives of the device. Junction temperature is a function of three factors: junction-to-ambient thermal resistance, power dissipation, and ambient temperature. $T_j$ can be expressed by Equation 1:

$$T_j = (\theta_{ja} \times P_d) + T_a \quad \text{(Equation 1)}$$

wherein $T_j$=junction temperature (in degrees C.);

$\theta_{ja}$=the junction-to-ambient thermal resistance (in degrees C./watt);

$P_d$=power dissipation at $T_j$ (in watts); and $T_a$=ambient temperature (in degrees C.).

The junction-to-ambient thermal resistance $\theta_{ja}$ can be represented by Equation 2:

$$\theta_{ja} = \theta_{jc} + \theta_{cs} + \theta_{sa} \quad \text{(Equation 2)}$$

wherein $\theta_{jc}$=the junction-to-case thermal resistance (in degrees C./watt);

$\theta_{cs}$=the case-to-sink thermal resistance (in degrees C./watt); and $\theta_{sa}$=the sink-to-ambient thermal resistance (in degrees C./watt);

In the foregoing definitions, the pertinent location of the case is the top center of the IC package, including any IHS forming part of the IC package. The pertinent location of the sink can be the geometric center of the heat sink.

The IC package 30 of FIG. 2 is for most purposes no longer capable of meeting the thermal-dissipating requirements of today's high performance electronic assemblies, as expressed in terms of the junction-to-ambient thermal resistance $\theta_{ja}$.

Embodiments of the present invention reduce the device junction temperature $T_j$ by reducing both the junction-to-case thermal resistance $\theta_{jc}$ and the case-to-sink thermal resistance $\theta_{cs}$. Processor assemblies for high performance servers have a very non-uniform power map or heat flux variation across the surfaces of the die. In a 3D thermal mapping, the hot spots appear as mountain peaks across the upper die surface, for example. It is the temperature of the highest flux area(s) that typically must be maintained at or below a specified value. While the silicon die provides some lateral heat spreading, it is insufficient to appreciably reduce the peak temperature(s).

Even the high thermal conductivity of copper (which is greater than three times that of silicon) is insufficient to handle the hot spots. If existing thermal dissipation structure is incapable of dissipating sufficient heat to maintain the die peak temperature below a specified value, the performance of the electronic assembly must be throttled back by reverting to a temperature-dependent processor power control process. Otherwise, the electronic assembly could malfunction or experience a catastrophic failure. Thus, with increased heat dissipation requirements for electronic assemblies, it has become necessary to substantially improve the performance of thermal interface materials and integrated heat spreaders.

Figure 3:
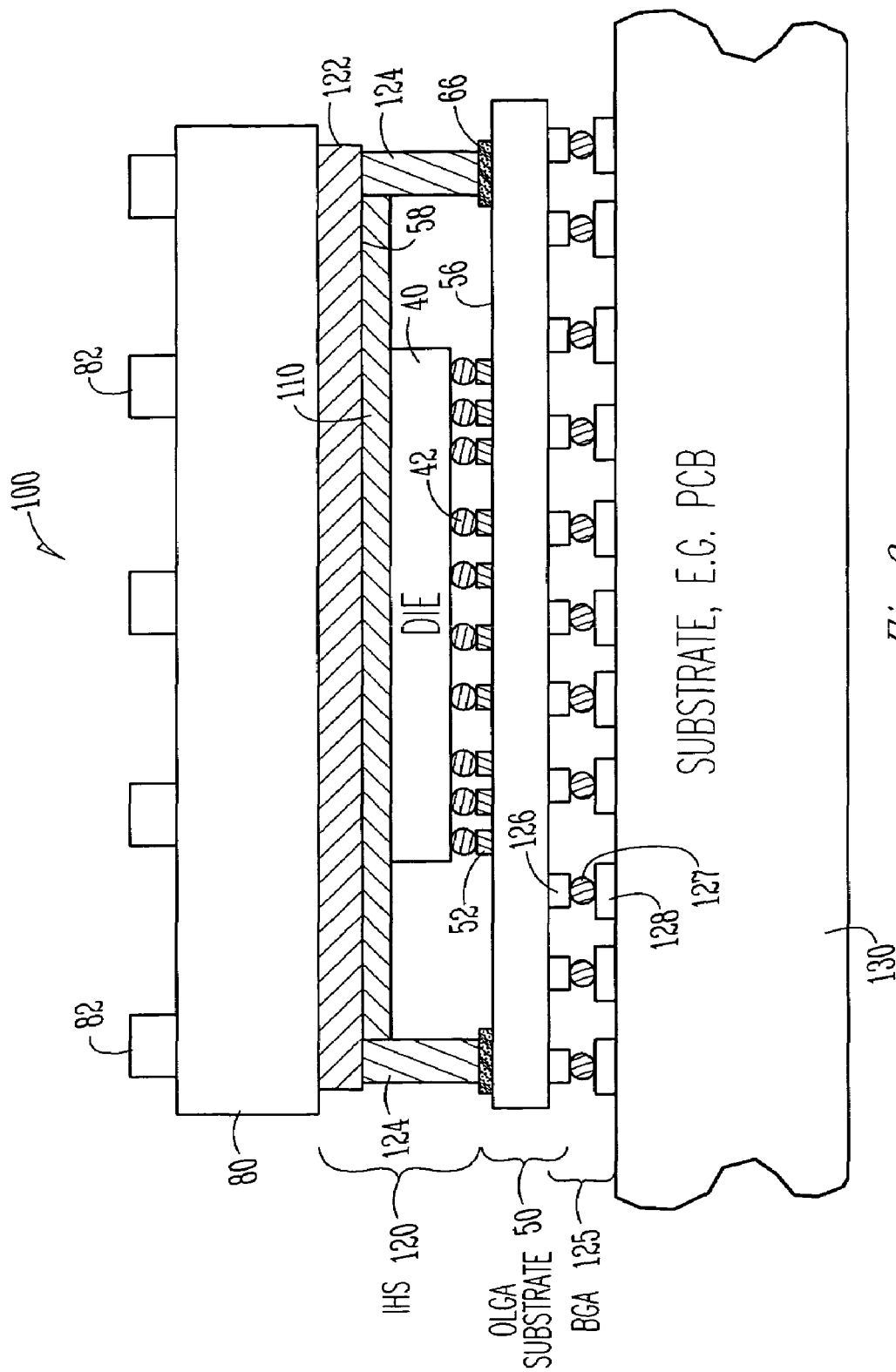
FIG. 3 illustrates a cross-sectional representation of an electronic assembly comprising an IC package with a high capacity thermal interface, in accordance with an embodiment of the inventive subject matter.

FIG. 3 illustrates a cross-sectional representation of an electronic assembly 100 comprising an IC package with a high capacity thermal interface 110, in accordance with an embodiment of the inventive subject matter. The IC package comprises a die 40 mounted on an organic land grid array (OLGA) substrate 50, and an integrated heat spreader (IHS) 120. While an OLGA substrate is shown, the present inventive subject matter is not limited to use with an OLGA substrate, and any other type of substrate can be employed. The IC package illustrated in FIG. 3 can form part of electronic assembly 4 shown in FIG. 1. Die 40 can be of any type. In an embodiment, die 40 is a processor.

In FIG. 3, die 40 comprises a plurality of signal conductors (not shown) that terminate in electrical contacts or lands on the bottom surface (not shown) of die 40. These lands can be coupled to corresponding electrical contacts or lands 52 representing signal, power, or ground nodes on the upper surface 56 of OLGA substrate 50 by appropriate connections such as C4 solder bumps 42. A suitable underfill (not shown), such as an epoxy material, can be used to surround C4 solder bumps 42 to provide mechanical stability and strength.

Still referring to FIG. 3, an integrated heat spreader (IHS) 120 forms a cover over die 40. IHS 120 is thermally coupled to an upper surface of die 40 through a high capacity thermal interface 110. Die 40 can thus dissipate a substantial amount of heat both laterally and vertically through thermal interface 110 to IHS 120.

Thermal interface 110 comprises a material that is capable of conducting heat at a high rate. In an embodiment, thermal interface 110 comprises diamond. A layer of thermal interface 110 comprising diamond has a very high thermal conductivity in all directions within the layer. In other embodiments, thermal interface 110 can comprise other materials with thermal qualities that are only slightly inferior to diamond, such as a diamond composite, or graphite. A suitable diamond composite can comprise a mixture of diamond particles and particles of another substance, such as aluminum or copper. While graphite is an excellent thermal conductor within a given plane of graphite material, it is not a good thermal conductor in a direction that is normal to a plane. However, graphite may suffice for applications that do not require optimal thermal dissipation.

IHS 120 includes a lid 122 and a side wall or support member 124. Thermal interface 110 is in contact with the lower surface 58 of lid 122 and with the upper surface of die 40. In an embodiment, thermal interface 110 is affixed to die 40 and/or to lid 122. In an embodiment, lid 122 of heat spreader 120 is substantially planar and has a surface area substantially larger than that of die 40. The terms "substantially larger" or "substantially smaller", as used herein to compare the relative sizes of the surface area of the heat spreader lid 122 and die 40, means at least 5% larger or smaller, respectively.

Thermal interface 110 can be formed in at least two different ways. For example, thermal interface 110 can be formed by growing it on the lower surface 58 of lid 122, as explained further regarding FIG. 5. Alternatively, thermal interface 110 can be formed apart from IHS 120 and subsequently affixed to lid 122 of IHS 120, as explained further regarding FIGS. 6 and 7.

In an embodiment, thermal interface 110 has a surface area that is substantially the same as the bottom surface area of lid 122. As viewed, for example, in FIG. 3, thermal interface 110 covers substantially the entire bottom surface of lid 122. Thermal interface 110 can extend laterally to be in contact with support member 124.

IHS 120 can be mechanically supported by coupling its support member 124 to the upper surface 56 of OLGA substrate 50 through a suitable sealant 66. In an embodiment, the support member 124 is located at the periphery of IHS 120. However, in other embodiments the lid 122 of IHS 120 can extend beyond the support member 124.

Sealant 66 can comprise a thermally conductive material such as a thermal grease or gel, or a heat-curable material such as a thermo-setting resin or epoxy. The thermally conductive material can comprise particles of metal or other thermally conductive substance(s).

To further increase the rate of heat dissipation from IHS 120, a heat sink 80 of any suitable shape (including optional heat fins 82), material, and size can optionally be coupled to or formed as part of the upper surface of the lid 122 of IHS 120.

OLGA substrate 50 can be of any type, including a multi-layer substrate. OLGA substrate 50 can be mounted to an additional substrate 130, such as a printed circuit board (PCB) or card. OLGA substrate 50 can comprise, for example, a plurality of lands 126 that can be mechanically and electrically coupled to corresponding lands 128 of substrate 130 by suitable connectors such as ball grid array (BGA) solder balls 127.

While a BGA arrangement 125 is illustrated in FIG. 3 for coupling OLGA substrate 50 to substrate 130, the present inventive subject matter is not limited to use with a BGA arrangement, and it can be used with any other type of packaging technology. Further, embodiments of the present invention are [is] not to be construed as limited to use in C4 packages, and they can be used with any other type of IC package where the herein-described features of the present inventive subject matter provide an advantage.

Figure 4:
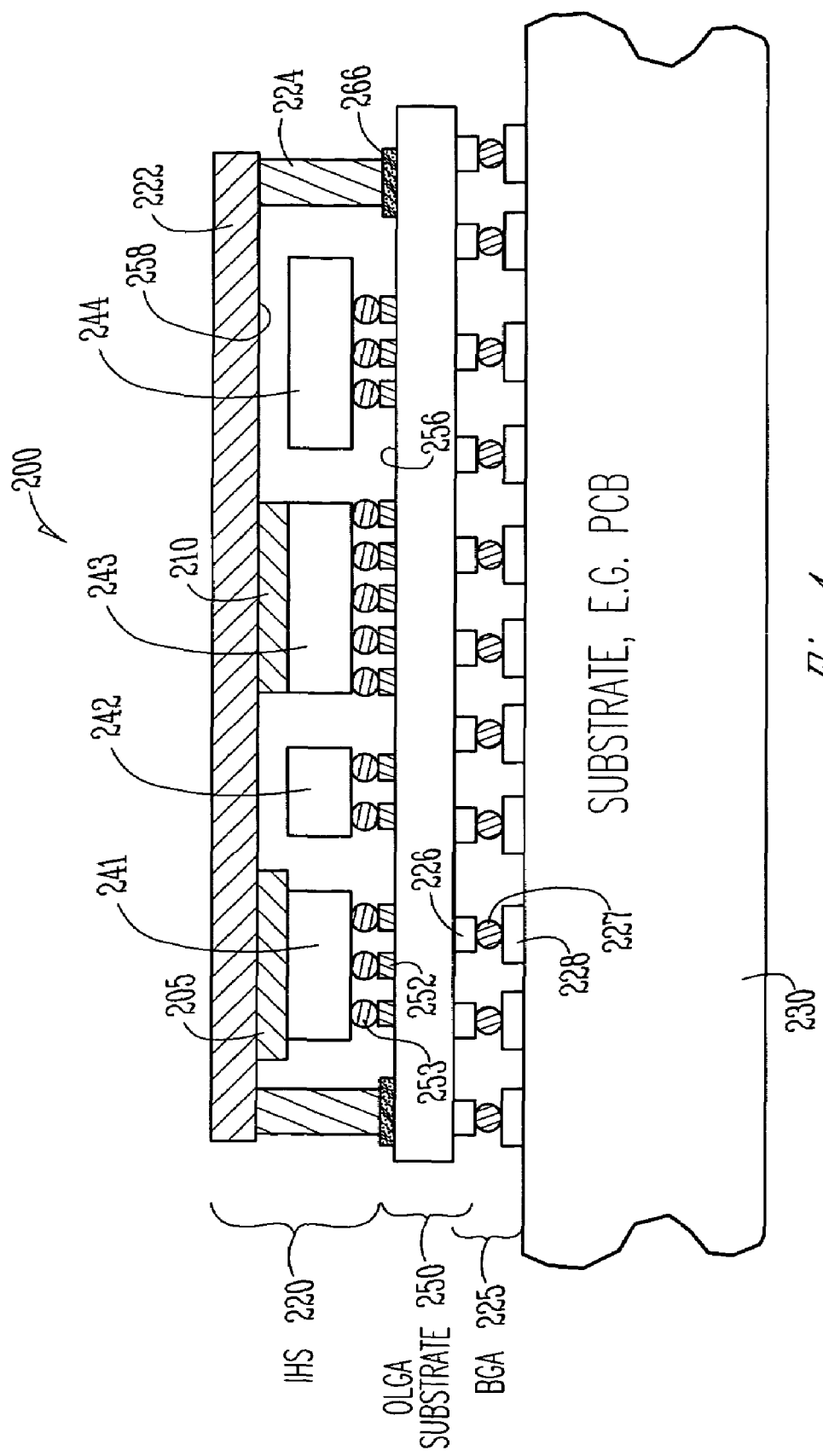
FIG. 4 illustrates a cross-sectional representation of an electronic assembly comprising a multi-chip IC package with a high capacity thermal interface, in accordance with another embodiment of the inventive subject matter.

FIG. 4 illustrates a cross-sectional representation of an electronic assembly 200 comprising a multi-chip IC package with a high capacity thermal interface, in accordance with another embodiment of the invention. While the embodiment shown in FIG. 3 has been described with reference to a single IC device, the inventive subject matter is not limited to packaging single IC's and can be used for packaging multiple IC's. One example is the multi-chip IC package or multi-chip module shown in FIG. 4.

Electronic assembly 200 comprises a plurality of IC's in the form of dice 241–244, which are mounted to lands 252 on an upper surface 256 of substrate 250 (which can be an OLGA substrate) via corresponding solder balls or bumps 253. While an OLGA substrate is shown, the inventive subject matter is not limited to use with an OLGA substrate, and any other type of substrate can be employed. The multi-chip module illustrated in FIG. 4 can form part of electronic assembly 4 shown in FIG. 1. Dice 241–244 can be of any type. In an embodiment, die 243 is a processor.

Certain ones of dice 241–244 are high heat producers, and they are coupled to IHS 220 through corresponding high capacity thermal interfaces. For example, dice 241 and 243 generate high thermal outputs and are thermally coupled to the under side 258 of IHS 220 through high capacity thermal interfaces 205 and 210, respectively. Normally, the thermal interface is wider than the die, as exemplified by thermal interface 205. However, the width of the thermal interface can alternatively be the same as or smaller than the width of the die, as exemplified by thermal interface 210. Moreover, the dimensions of the thermal interface can be tailored to the die hot spots. For example, one or more thermal interfaces can be positioned over a corresponding number of die hot spots.

IHS 220 includes a lid 222 and a side wall or support member 224. Thermal interfaces 205 and 210 are in contact with the lower surface 258 of lid 222 and with the upper surfaces of dice 241 and 243, respectively.

IHS 220 can be mechanically secured by coupling its support member 224 to the upper surface 256 of OLGA substrate 250 through a suitable sealant 266. As mentioned regarding FIG. 3, the support member 224 is shown located at the periphery of IHS 220; however, in other embodiments the lid 222 of IHS 220 can extend beyond the support member 224. To further increase the rate of heat dissipation from IHS 220, a heat sink (not shown) of any suitable shape, material, and size can optionally be coupled to or formed as part of the upper surface of the lid 222 of IHS 220.

OLGA substrate 250 can be of any type, including a multi-layer substrate. OLGA substrate 250 can be mounted to an additional substrate 230, such as a printed circuit board (PCB) or card. OLGA substrate 250 can comprise, for example, a plurality of lands 226 that can be mechanically and electrically coupled to corresponding lands 228 of substrate 230 by suitable connectors such as ball grid array (BGA) solder balls 227.

While a BGA arrangement 225 is illustrated in FIG. 4 for coupling OLGA substrate 250 to substrate 230, embodiments of the present invention are not limited to use with a BGA arrangement, and they can be used with any other type of packaging technology. Further, the present inventive subject matter is not to be construed as limited to use in C4 packages, and it can be used with any other type of IC package where the herein-described features of the present inventive subject matter provide an advantage.

While in the embodiment shown in FIG. 4, individual thermal interfaces, such as thermal interfaces 205 and 210, have been provided for only certain dice, such as dice 241 and 243, in another embodiment of a multi-chip module, a continuous thermal interface layer could be provided between all of the dice 241–244 and the lid 222 of IHS 220. Such a thermal interface could have a surface area that is substantially coextensive with the bottom surface area of lid 222.

The fabrication of an IC package comprising a high capacity thermal interface will now be described.

FABRICATION

In order to successfully fabricate an IC package with the advantages described above, it is necessary to form a layer of high capacity thermal interface material, such as diamond. It is also important to affix the high capacity thermal interface securely to the under side of IHS as well as to the top side of the die. To do so requires a die surface that is readily solderable. In an embodiment wherein the thermal interface is grown apart from the IHS, it is also important to have an IHS that is readily solderable. It is also desirable to provide at least one solderable surface on the thermal interface. Each of the above-mentioned factors will now be described in sufficient detail to enable one of ordinary skill in the art to understand and practice the inventive subject matter.

Figure 5:
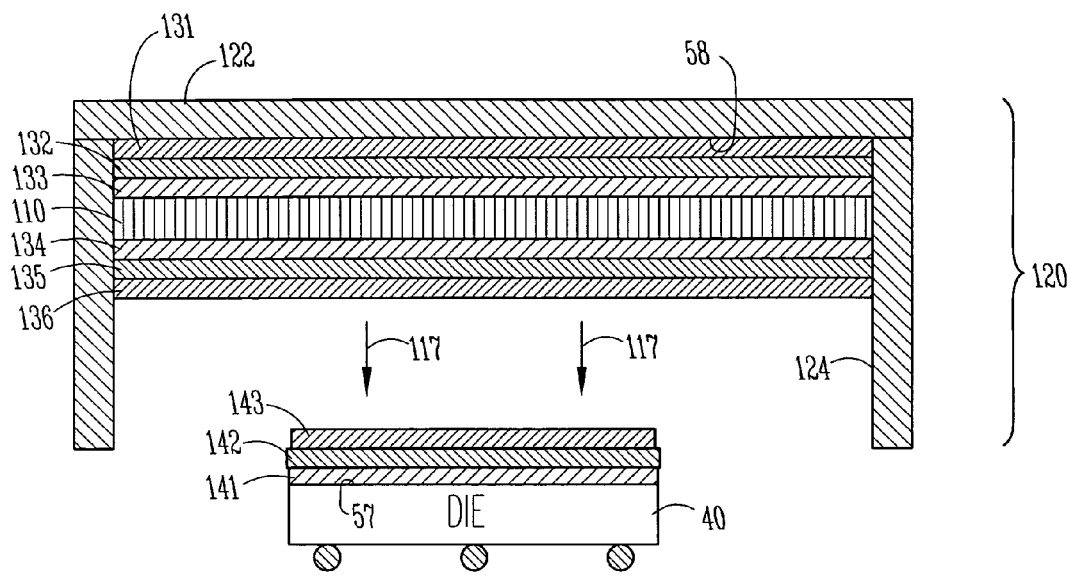
FIG. 5 illustrates a cross-sectional representation of a high capacity thermal interface formed on an integrated heat spreader, in accordance with an embodiment of the inventive subject matter.

FIG. 5 illustrates a cross-sectional representation of a high capacity thermal interface 110 formed on an IHS 120, in accordance with an embodiment of the invention. As mentioned earlier, thermal interface 110 (FIGS. 3 and 5) can be formed by growing it on the under surface 58 of lid 122. In an embodiment, a layer of amorphous or polycrystalline diamond is grown on surface 58 using suitable chemical deposition methods, such as chemical vapor deposition (CVD). Generally, polycrystalline diamond is preferred to amorphous diamond, because the former has superior heat-dissipating characteristics.

In order to grow a diamond layer on a bare (unplated) surface 58 of lid 122 of IHS 120, one or more adhesion layers 131–133 of a suitable material must first be affixed to surface 58. It is assumed that IHS 120 is formed of copper in this example, but it can be formed of different materials than copper.

The one or more adhesion layers 131–133 can comprise metal from a group that includes chromium, gold, nickel, platinum, silver, titanium, tungsten, and vanadium, or alloys thereof. Because diamond that is grown through a CVD process adheres well to titanium, titanium is generally used for layers that are in contact with diamond. However, tungsten could be substituted for titanium.

A layer 131 of nickel is first formed on surface 58 of lid 122.

Next a layer 132 of nickel-vanadium is formed on layer 131. Either platinum or chromium could be substituted for nickel-vanadium.

Next a layer 133 of titanium is formed on layer 132.

Next a thermal interface layer 110 of diamond material is formed, for example using CVD, on the adhesion layer 133. The layer of thermal interface 110 can be formed of a thickness that is suitable for the thermal requirements of the IC package. That is, it can be thicker for higher heat dissipation requirements, or thinner for less demanding heat dissipation requirements. The thickness of thermal interface 110 can be, for example, 500 microns for high heat dissipation or 75 microns for lower heat dissipation.

To provide a suitable solderable surface on the lower surface of thermal interface 110, one or more additional adhesion layers 134–136 are added.

In an embodiment, a layer 134 of titanium is first applied to thermal interface layer 110.

Next a layer 135 of nickel-vanadium is formed on layer 134. Either platinum or chromium could be substituted for nickel-vanadium.

Finally a layer 136 of gold is formed on layer 135. Nickel could be substituted for gold.

In addition, one or more adhesion layers 141–143 can be formed on the upper surface 57 of die 40 in order to provide a suitable material for the lower-most adhesion layer 136 of IHS 120 to attach to.

In an embodiment, a layer 141 of titanium is formed on the upper surface 57 of die 40.

Next a layer 142 of nickel-vanadium is formed on layer 141. Either platinum or chromium could be substituted for nickel-vanadium.

Finally a layer 143 of gold is formed on layer 142. Nickel could be substituted for gold.

Prior to undergoing solder reflow, a suitable flux and solder paste are applied to one or both of layers 136 and 143, and IHS 120 is moved in the direction indicated by arrows 117, so that layer 136 comes into contact with layer 143.

In an embodiment, the titanium layers are approximately 200–500 Angstroms (A) in thickness; the nickel-vanadium layers are approximately 3500 A; and the gold layers are approximately 1000 A.

Figure 6:
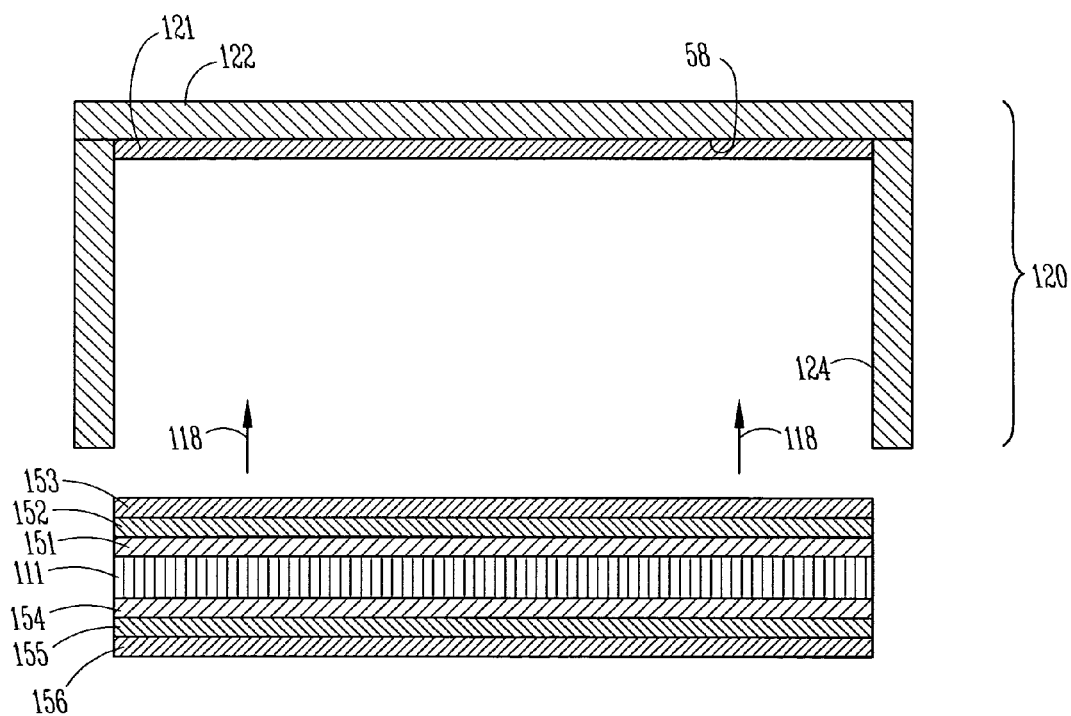
FIG. 6 illustrates a cross-sectional representation of a high capacity thermal interface to be affixed to an integrated heat spreader, in accordance with another embodiment of the inventive subject matter.

FIG. 6 illustrates a cross-sectional representation of a high capacity thermal interface 111 to be affixed to an IHS 120, in accordance with another embodiment of the invention.

As mentioned earlier, the thermal interface 111 can be formed apart from IHS 120 and subsequently affixed to the lower surface 58 of lid 122 of IHS 120, as will now be explained regarding FIGS. 6 and 7.

An amorphous or polycrystalline diamond layer 111 can be grown by any suitable method. The thickness of layer 111 can vary depending upon the thermal requirements of the IC package. In an embodiment, layer 111 is several hundred microns thick; however, embodiments of the invention are not limited to any particular thickness.

To facilitate affixing the thermal interface layer 111 to the under surface 58 of IHS 120, one or more adhesion layers 121 of suitable material can be formed on the under side 58 of lid 122. In addition, one or more adhesion layers 151–153 of suitable material can be formed on the upper surface of thermal interface layer 111. In addition, one or more adhesion layers 154–156 of suitable material can be formed on the lower surface of thermal interface layer 111 to provide a suitable bonding platform for a connection with the upper surface of die 40 (FIG. 5).

Adhesion layers 121 and 151–156 can comprise metal from a group that includes chromium, gold, nickel, platinum, silver, titanium, tungsten, and vanadium, or alloys thereof. In an embodiment, layers 151 and 154 comprise titanium; layers 152 and 155 comprise nickel-vanadium; and layers 121, 153, and 156 comprise gold. However, as mentioned above regarding FIG. 5, other materials could be substituted for these particular substances.

Prior to undergoing solder reflow, a suitable flux and solder paste are applied to one or both of layers 121 and 153, and thermal interface layer 111 is moved in the direction indicated by arrows 118, so that layer 153 comes into contact with layer 121.

While in the embodiments illustrated in FIGS. 5 and 6, thermal interface 110 is described as being affixed to IHS 120 and to die 40 through the use of solder, other attachment techniques could also be used.

The above-described composition, dimensions, number, and order of layers are merely exemplary of the embodiments illustrated, and they are not meant to be limiting.

Figure 7:
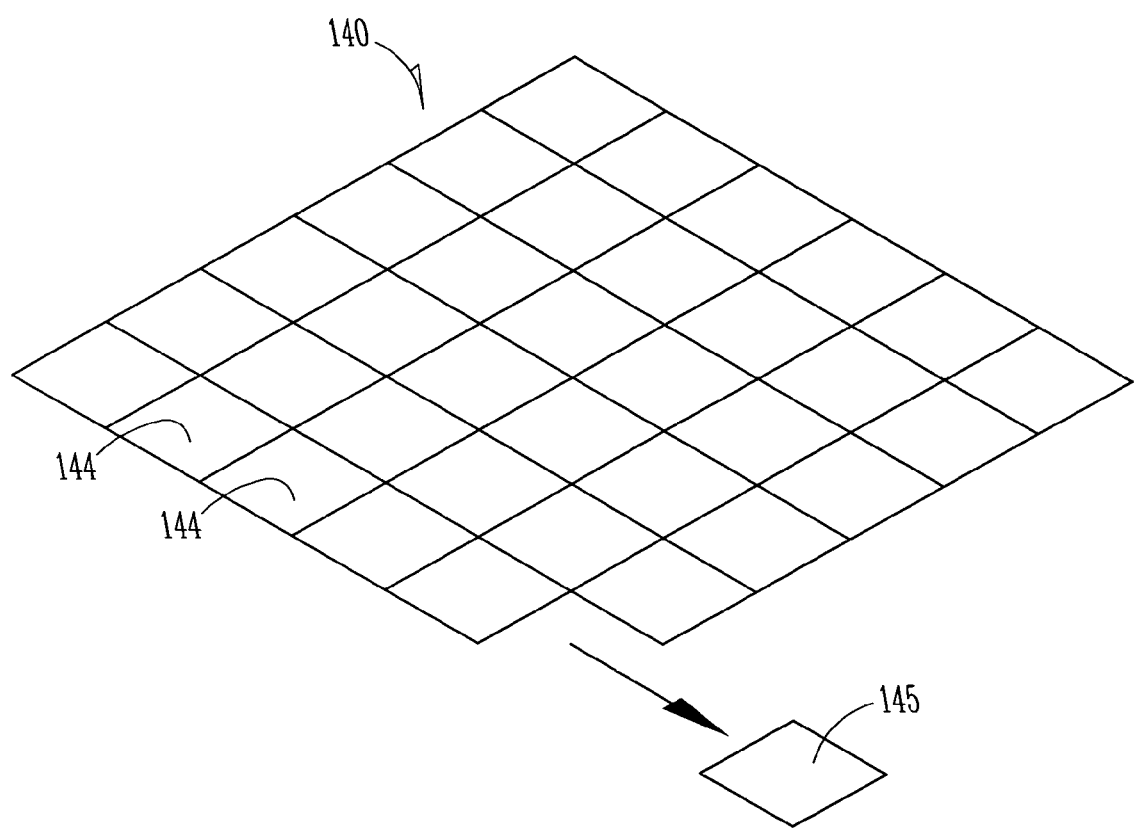
FIG. 7 is a view of a wafer of diamond thermal interface material, which has been grown separate from an IHS, and a segment thereof prior to attachment to an IHS, in accordance with another embodiment of the inventive subject matter.

FIG. 7 is a view of a wafer 140 of diamond thermal interface material, which has been grown separate from an IHS, and a segment 145 thereof prior to attachment to an IHS, in accordance with another embodiment of the invention.

The thermal interface 111 described in FIG. 6, including any adhesion layers 151–156, will typically be formed in a large wafer 140 comprising a plurality of individual thermally conductive elements 144. These elements can be separated from wafer 140. For example, element 145 has been separated from wafer 140.

Figure 8:
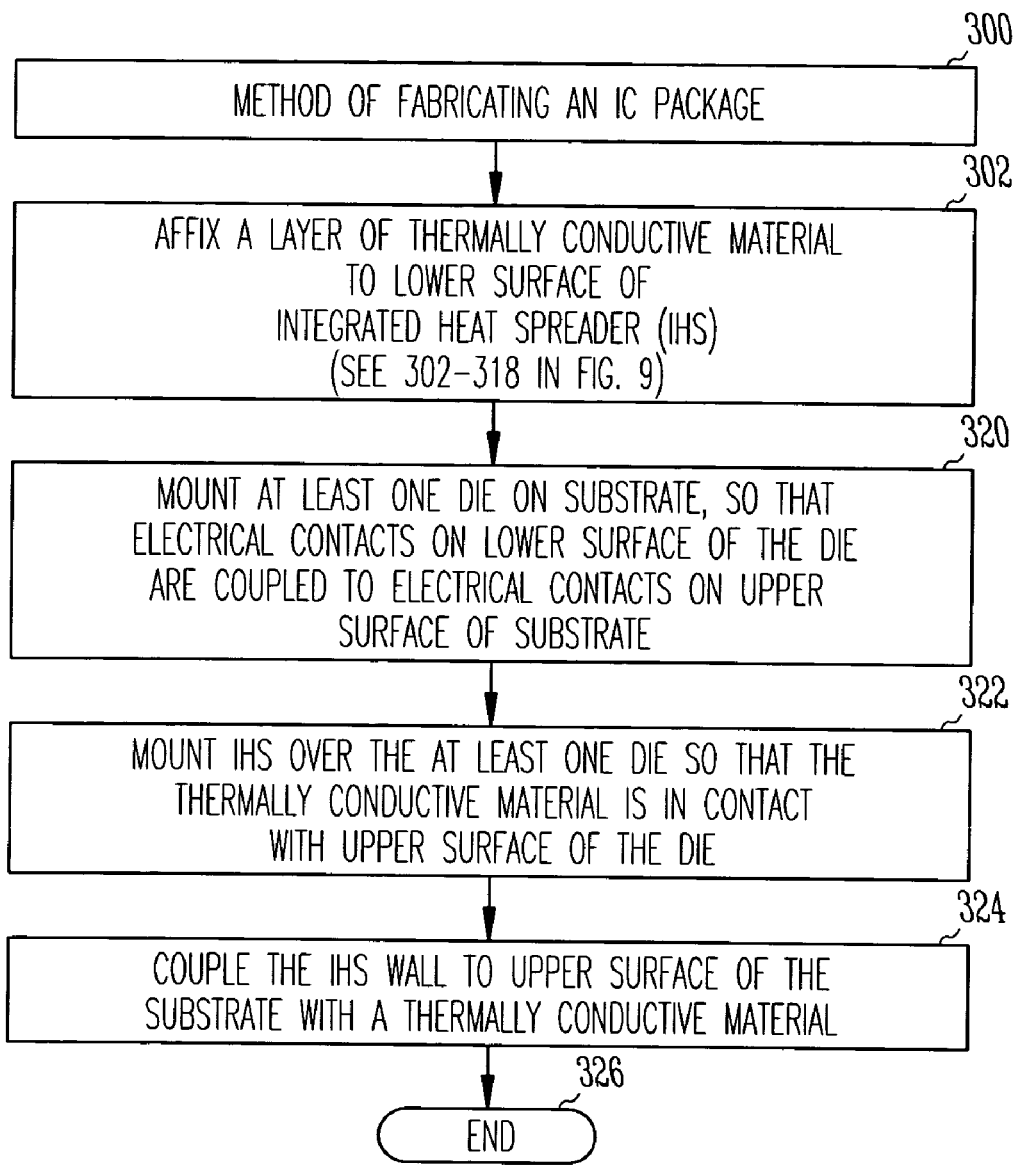
FIG. 8 is a flow diagram of a method of fabricating an IC package, in accordance with an embodiment of the inventive subject matter.

FIG. 8 is a flow diagram of a method of fabricating an IC package, in accordance with an embodiment of the invention. The method begins at 300.

In 302, a layer of thermally conductive material is affixed to the lower surface (e.g. 58, FIG. 3) of an integrated heat spreader (IHS) (e.g. 120, FIG. 3). For further details concerning this operation, refer to FIG. 9 and its description below.

In 320, at least one die (e.g. 40, FIG. 3) is mounted on a substrate (e.g. 50, FIG. 3), so that electrical contacts on a lower surface of the die are coupled to corresponding contacts (e.g. 52, FIG. 3) on the upper surface (e.g. 56, FIG. 3) of the substrate.

In 322, the IHS is mounted over at least one die so that the thermally conductive material is in contact with an upper surface of the die.

In 324, the IHS wall (e.g. 124, FIG. 3) is coupled to the upper surface of the substrate with a thermally conductive material (e.g. 66, FIG. 3).

A suitable process for performing 322 and 324 will now be described with reference to FIG. 3. Solder paste is first applied to the back side of the die 40. Alternatively, the solder paste could be applied to the surface of the thermally conductive element 110 that faces the back side of the die. Then a suitable sealant 66 is applied to the OLGA substrate 50 where the periphery or boundary of IHS 120 will make contact when it is positioned over the die 40.

Next, the IHS 120 is aligned, and an appropriate force can be applied, for example using a spring, to hold IHS 120 in position. The package is then put into a suitable heating environment, such as a flow furnace, for solder reflow. Following solder join of the thermal interface, the sealant at the IHS boundary is cured in a conventional oven. Post cure, the securing spring is removed.

The method illustrated in FIG. 8 ends at 326.

Figure 9:
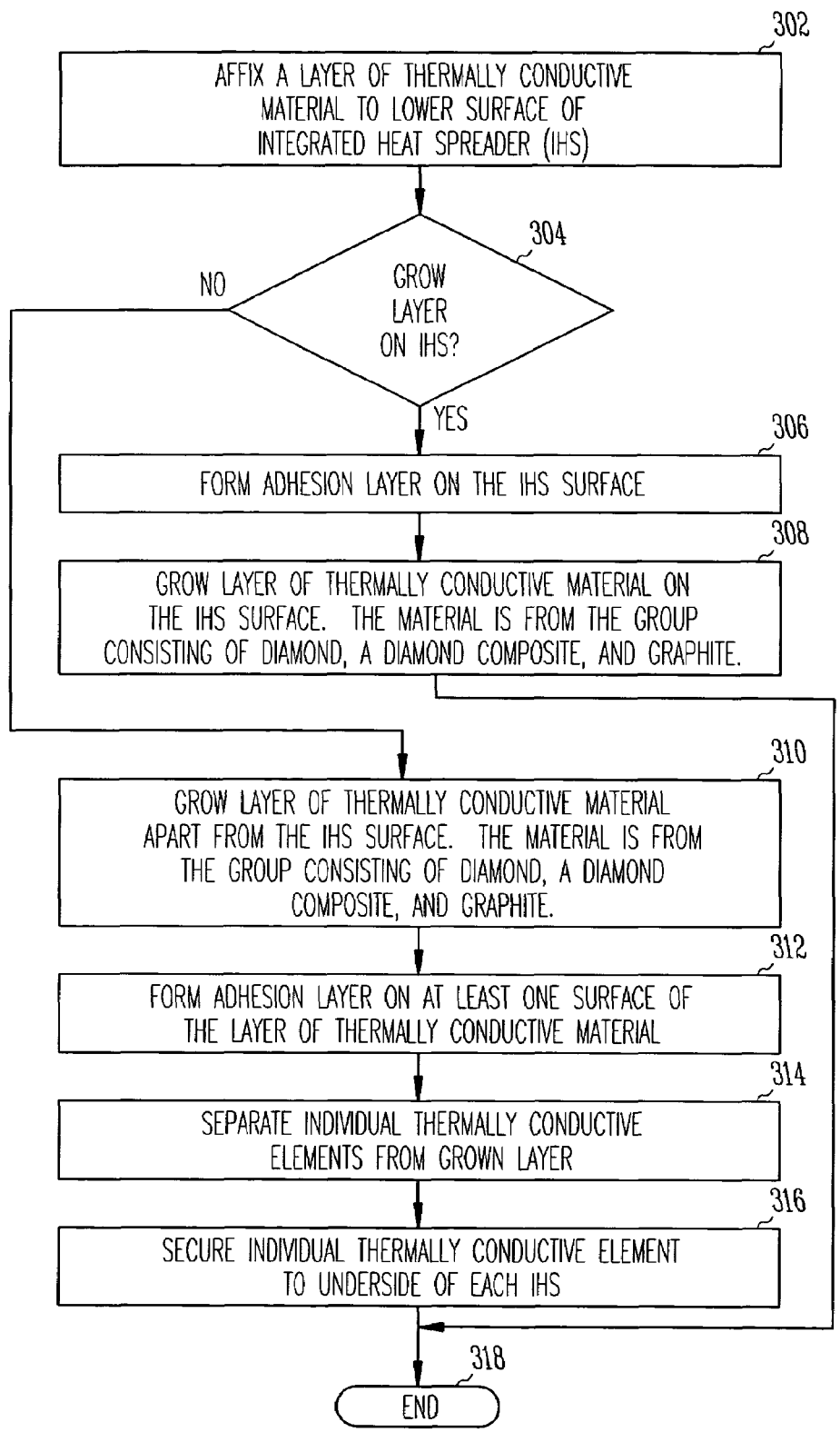
FIG. 9 is a flow diagram of two alternative methods of affixing a layer of thermally conductive material to an integrated heat spreader (IHS).

FIG. 9 is a flow diagram of two alternative methods of affixing a layer of thermally conductive material to an integrated heat spreader (IHS). FIG. 9 elaborates upon 302 of FIG. 8.

In 304, a determination is made whether a layer of thermally conductive material is to be grown on the lower surface of the IHS. If yes, the method proceeds to 306; otherwise, it proceeds to 310.

In 306, an adhesion layer (e.g. one or more layers 131–133, FIG. 5) is formed on the IHS surface.

In 308, a layer of thermally conductive material (e.g. 110, FIG. 5) is grown on the adhesion layer of the IHS surface. The material is from the group consisting of diamond, a diamond composite, and graphite.

In 310, a layer of thermally conductive material (e.g. 111, FIG. 5) is grown apart from the IHS surface. The material is from the group consisting of diamond, a diamond composite, and graphite. The layer can be grown in the form of a wafer (140, FIG. 7).

In 312, an adhesion layer (e.g. one or more layers 151–156, FIG. 6) is formed on at least one surface of the layer of thermally conductive material.

In 314, individual thermally conductive elements (e.g. 145, FIG. 7) are separated from the grown layer.

In 316, individual thermally conductive elements are secured to the under side of each IHS (e.g. 120, FIG. 6). The methods end at 318.

The operations described above with respect to the methods illustrated in FIGS. 8 and 9 can be performed in a different order from those described herein.

The above-described choice of materials; geometry; number, order, dimensions, and composition of layers; mechanisms for affixing; and assembly sequencing can all be varied by one of ordinary skill in the art to optimize the thermal performance of the package.

Any suitable method, or combination of different methods, for depositing the metal layers can be used, such as plating, sputtering, vapor, electrical, screening, stenciling, chemical including chemical vapor deposition (CVD), vacuum, and so forth.

Before deposition of the one or more metal layers, the surface of the die can be prepared with a sputter etch, if desired, to improve the adhesion of the adhesion layer to the die surface; however, a sputter etch is not essential. Nor is the condition of the wafer surface essential. The wafer surface can be in unpolished, polished, or back-ground form.

The particular implementation of the IC package is very flexible in terms of the orientation, size, number, order, and composition of its constituent elements. Various embodiments of the invention can be implemented using various combinations of substrate technology, IHS technology, high capacity thermal interface material, adhesion materials, and sealant to achieve the advantages of the present inventive subject matter. The structure, including types of materials used, dimensions, layout, geometry, and so forth, of the IC package can be built in a wide variety of embodiments, depending upon the requirements of the electronic assembly of which it forms a part.

FIGS. 3–7 are merely representational and are not drawn to scale. Certain proportions thereof may be exaggerated, while others may be minimized. FIGS. 3–7 are intended to illustrate various implementations of the inventive subject matter that can be understood and appropriately carried out by those of ordinary skill in the art.

The present inventive subject matter provides for an electronic assembly and methods of manufacture thereof that minimize thermal dissipation problems associated with high power delivery. An electronic system and/or data processing system that incorporates one or more electronic assemblies that utilize the present inventive subject matter can handle the relatively high power densities associated with high performance integrated circuits, and such systems are therefore more commercially attractive.

By substantially increasing the thermal dissipation from high performance electronic assemblies, such electronic equipment can be operated at increased clock frequencies. Alternatively, such equipment can be operated at reduced clock frequencies but with lower operating temperatures for increased reliability.

As shown herein, the present inventive subject matter can be implemented in a number of different embodiments, including a heat-dissipating structure, an integrated circuit package, an electronic assembly, an electronic system in the form of a data processing system, and various methods of fabricating an IC package. Other embodiments will be readily apparent to those of ordinary skill in the art. The elements, materials, geometries, dimensions, and sequence of operations can all be varied to suit particular packaging requirements.

While certain operations have been described herein relative to "upper" and "lower" surfaces, it will be understood that these descriptors are relative, and that they would be reversed if the IC package were inverted. Therefore, these terms are not intended to be limiting.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present inventive subject matter. Therefore, it is manifestly intended that embodiments of this invention be limited only by the claims and the equivalents thereof.

What is claimed is:

1. A method of fabricating an integrated circuit package, the method comprising:
    affixing a layer of thermally conductive material to a lower surface of a heat spreader, the material being from the group consisting of diamond, a diamond composite, and graphite;
    mounting a die on a substrate, so that electrical contacts on a lower surface of the die are coupled to electrical contacts on an upper surface of the substrate; and
    mounting the heat spreader over the die so that the thermally conductive material is in contact with the upper surface of the die.

2. The method recited in claim 1 wherein affixing comprises:
    growing the layer of thermally conductive material on the heat spreader surface.

3. The method recited in claim 2 and further comprising:
    forming a layer of metal on the heat spreader surface, the layer of metal being from the group consisting of chromium, gold, nickel, platinum, silver, titanium, tungsten, and vanadium.

4. The method recited in claim 1 and further comprising:
    growing the layer of thermally conductive material apart from the heat spreader surface.

5. The method recited in claim 4 and further comprising:
    forming a layer of metal on at least one surface of the layer of thermally conductive material, the layer of metal being from the group consisting of titanium and tungsten.

6. The method recited in claim 1 wherein the heat spreader comprises a wall, the method further comprising:
    coupling the heat spreader wall to the upper surface of the substrate.

7. The method recited in claim 6 wherein the heat spreader wall is coupled to the upper surface of the substrate with a thermally conductive material.

8. A method comprising:
    forming a layer of thermally conductive material on a surface of a heat spreader, the material being from the group consisting of diamond, a diamond composite, and graphite.

9. The method recited in claim 8 and further comprising:
    mounting a die on a substrate, so that electrical contacts on a lower surface of the die are coupled to electrical contacts on an upper surface of the substrate; and
    mounting the heat spreader over the die so that the layer of thermally conductive material is in contact with the upper surface of the die.

10. The method recited in claim 8 and further comprising:
    forming at least one adhesion layer between the layer of thermally conductive material and the surface of the heat spreader.

11. The method recited in claim 10 wherein the at least one adhesion layer is formed of material from the group consisting of chromium, gold, nickel, platinum, silver, titanium, tungsten, and vanadium.

12. The method recited in claim 10 and further comprising:
    mounting a die on a substrate, so that electrical contacts on a lower surface of the die are coupled to electrical contacts on an upper surface of the substrate; and mounting the heat spreader over the die so that the layer of thermally conductive material is in contact with the upper surface of the die.

13. The method recited in claim 8 and further comprising:
forming at least one adhesion layer on the layer of thermally conductive material and not contacting the heat spreader.

14. The method recited in claim 13 wherein the at least one adhesion layer is formed of material from the group consisting of chromium, gold, nickel, platinum, silver, titanium, tungsten, and vanadium.

15. The method recited in claim 13 and further comprising:
mounting a die on a substrate, so that electrical contacts on a lower surface of the die are coupled to electrical contacts on an upper surface of the substrate; and
mounting the heat spreader over the die so that the at least one adhesion layer is in contact with the upper surface of the die.

16. The method recited in claim 8 wherein forming comprises growing the layer of thermally conductive material on the surface of the heat spreader.

17. The method recited in claim 8 wherein forming comprises:
growing the layer of thermally conductive material apart from the surface of the heat spreader; and
securing the layer of thermally conductive material to the surface of the heat spreader.

18. A method of fabricating an integrated circuit package, the method comprising:
coupling a layer of thermally conductive material to a surface of a substantially planar heat spreader, the material comprising diamond.

19. The method recited in claim 18 and further comprising:
mounting a die on a substrate, so that electrical contacts on a lower surface of the die are coupled to electrical contacts on an upper surface of the substrate; and
mounting the heat spreader over the die so that the layer of thermally conductive material is in contact with the upper surface of the die.

20. The method recited in claim 18 and further comprising:
forming at least one adhesion layer between the layer of thermally conductive material and the surface of the heat spreader.

21. The method recited in claim 20 wherein the at least one adhesion layer is formed of material from the group consisting of chromium, gold, nickel, platinum, silver, titanium, tungsten, and vanadium.

22. The method recited in claim 20 and further comprising:
mounting a die on a substrate, so that electrical contacts on a lower surface of the die are coupled to electrical contacts on an upper surface of the substrate; and
mounting the heat spreader over the die so that the layer of thermally conductive material is in contact with the upper surface of the die.

23. The method recited in claim 18 and further comprising:
forming at least one adhesion layer on the layer of thermally conductive material and not contacting the heat spreader.

24. The method recited in claim 23 wherein the at least one adhesion layer is formed of material from the group consisting of chromium, gold, nickel, platinum, silver, titanium, tungsten, and vanadium.

25. The method recited in claim 23 and further comprising:
mounting a die on a substrate, so that electrical contacts on a lower surface of the die are coupled to electrical contacts on an upper surface of the substrate; and
mounting the heat spreader over the die so that the at least one adhesion layer is in contact with the upper surface of the die.

26. The method recited in claim 18 wherein forming comprises growing the layer of thermally conductive material on the surface of the heat spreader.

27. The method recited in claim 18 wherein forming comprises:
growing the layer of thermally conductive material apart from the surface of the heat spreader; and
securing the layer of thermally conductive material to the surface of the heat spreader.

* * * * *

UNITED STATES PATENT AND TRADEMARK OFFICE
CERTIFICATE OF CORRECTION

PATENT NO. : 7,098,079 B2　　　　　　　　　　　　　　　　　　　　　　　　Page 1 of 1
APPLICATION NO. : 10/655728
DATED : August 29, 2006
INVENTOR(S) : Chrysler et al.

It is certified that error appears in the above-identified patent and that said Letters Patent is hereby corrected as shown below:

On the Title page, Item (56), under "Foreign Patent Documents", line 1, after "1/1990" insert -- H01L 23/36 --.

On the Title Page , Item (56), under "Foreign Patent Documents", line 2, after "5/1999" insert -- H01L 21/48 --.

On the Title Page, Item (56), under "Foreign Patent Documents", line 4, after "5/2001" insert -- C23C 16/27 --.

On the Title Page, Item (56), under "Other Publications", line 3, delete "Aug." and insert -- Aug., --, therefor.

Signed and Sealed this

Twenty-fourth Day of June, 2008

JON W. DUDAS
*Director of the United States Patent and Trademark Office*